(12) United States Patent  (10) Patent No.: US 7,499,840 B2
Kropaczek et al.  (45) Date of Patent: Mar. 3, 2009

(54) METHOD AND APPARATUS FOR CREATING AND EDITING A NUCLEAR REACTOR CORE LOADING TEMPLATE

(75) Inventors: David Joseph Kropaczek, Wilmington, NC (US); Steven Barry Sutton, Wilmington, NC (US); Christian Carlos Oyarzun, Wilmington, NC (US); Carey Reid Merritt, Wilmington, NC (US)

(73) Assignee: Global Nuclear Fuel - Americas, LLC, Wilmington, NC (US)

( * ) Notice: Subject to any disclaimer, the term of this patent is extended or adjusted under 35 U.S.C. 154(b) by 849 days.

(21) Appl. No.: 10/678,183

(22) Filed: Oct. 6, 2003

(65) Prior Publication Data

US 2009/0024365 A1 Jan. 22, 2009

(51) Int. Cl.
*G06F 17/50* (2006.01)
*G21C 19/00* (2006.01)

(52) U.S. Cl. .............................. 703/2; 703/6; 376/260; 376/267

(58) Field of Classification Search .................. 703/2, 703/1, 6; 376/256, 267, 237, 260; 434/218; 345/473
See application file for complete search history.

(56) References Cited

U.S. PATENT DOCUMENTS

| | | | | |
|---|---|---|---|---|
| 4,605,530 | A | * | 8/1986 | Tatemichi ................... 376/237 |
| 5,406,598 | A | * | 4/1995 | Takeuchi et al. ............ 376/254 |
| 6,404,437 | B1 | * | 6/2002 | Russell et al. ............... 345/473 |
| 6,631,384 | B1 | * | 10/2003 | Richman et al. ......... 707/104.1 |
| 6,931,090 | B2 | * | 8/2005 | Chao et al. ................... 376/267 |
| 7,200,541 | B2 | * | 4/2007 | Kropaczek et al. ............. 703/13 |
| 7,222,061 | B2 | * | 5/2007 | Russell et al. ................. 703/18 |
| 2004/0101083 | A1 | * | 5/2004 | Russell et al. ............... 376/256 |
| 2004/0191734 | A1 | * | 9/2004 | Russell et al. ............... 434/218 |
| 2004/0196946 | A1 | * | 10/2004 | Chao et al. ................... 376/267 |
| 2005/0086036 | A1 | * | 4/2005 | Kropaczek et al. ............. 703/6 |

* cited by examiner

*Primary Examiner*—Thai Phan
(74) *Attorney, Agent, or Firm*—Harness, Dickey & Pierce, PLC

(57) ABSTRACT

The apparatus for creating and editing a nuclear reactor core template includes a graphical user interface and a processor controlling the graphical user interface to display a graphical representation of a nuclear reactor core. Via the graphical user interface, the processor provides a user with graphical tools for at least one of assigning fuel bundle categories to fuel bundle positions in the graphical representation and editing assigned fuel bundle categories to the fuel bundle positions in the graphical representation.

13 Claims, 2 Drawing Sheets

METHOD AND APPARATUS FOR CREATING AND EDITING A NUCLEAR REACTOR CORE LOADING TEMPLATE

BACKGROUND

The information setting forth the placement of fuel bundles, each of which has various attributes, in a nuclear reactor core is referred to as the loading map. In conventional core design, creating the loading map is an experienced based, trial and error, iterative process.

The core designer generally receives plant specific critical to quality factors such as plant cycle energy requirements, thermal and operational limits, shut down margins, etc. The core designer will also have information on the layout of the reactor core; namely, an indication of the how the nuclear fuel bundles are positioned within the core. Some of the critical to quality factors may even concern the layout. For example, the core designer may receive input requiring the positioning of certain fuel bundles within the layout.

Given this information, the core designer then makes a guess, based on experience and various rules of thumb he may have developed over time, on the initial positioning of fuel bundles in the reactor core. Specifically, the core designer guesses how many fresh fuel bundles to place in the core, and what types of fresh fuel bundles to use. A fresh fuel bundle is a fuel bundle that has not been exposed. Fuel bundles of the same type have substantially the same attributes. The attributes include but are not limited to: uranium loading, average enrichment, gadolinia loading, number of axial zones, product line, and thermal-mechanical characteristics of the fuel bundles. Different types of fresh fuel bundles have one or more different attributes. In deciding how many fresh fuel bundles to use, the core designer is also deciding how many of the fuel bundles currently in the core to reuse. Reusing the fuel bundles currently present in the core can mean leaving a fuel bundle in its existing location, or moving the fuel bundle to a different location in the core.

As part of the core design, the core designer also determines other operational parameters of the reactor core such as control blade positions, core flow, etc. Having specified these operational control parameters, a Nuclear Regulatory Commission (NRC) licensed simulation program is then run on the initial core design. Based on the results of the simulation, the core designer utilizes experience and rules of thumb to fix perceived problems in the design and, in general, improve the design; particularly with respect to the critical to quality factors. These changes may include changing the loading map. The process repeats until the core designer is satisfied with the design.

SUMMARY OF THE INVENTION

The present invention provides a method to capture and reuse the experience and rules of thumb developed by the core designer to make developing the loading map a more efficient process.

In one exemplary embodiment of the present invention, a graphical user interface under the control of a computer processor provides a user with the ability to design and save a template for a loading map. The template sets forth the category of fuel bundle that should be placed in each reactor fuel bundle position within a reactor core. This embodiment may further provide the user with the ability to specify type and/or attribute information regarding the categories of fuel bundles set forth in the template.

In another exemplary embodiment, a graphical user interface under the control of a computer processor provides a user with the ability to edit a template being designed or previously designed.

In a further exemplary embodiment, a user accesses a saved loading map for a cycle of a nuclear reactor, and instructs the computer processor to derive a template from the loading map based on user input parameters. The computer processor, according to methodologies of the present invention, derives the loading template. The user may then save and/or edit the derived template.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting on the present invention and wherein.

DETAILED DESCRIPTION OF THE EXEMPLARY EMBODIMENTS

A Generic Architecture for Implementing the Core Loading Template

Figure 1:
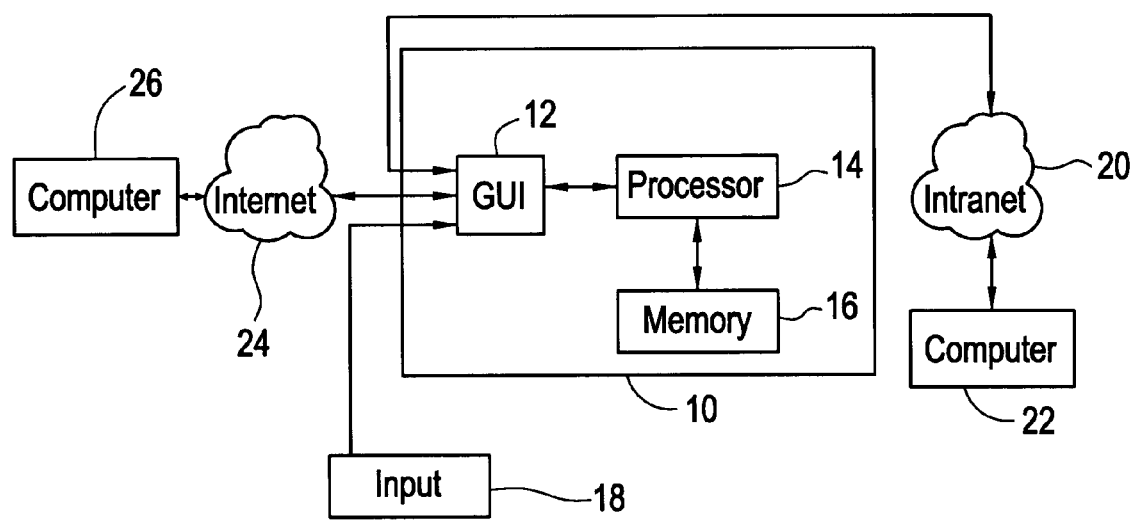
FIG. 1 illustrates an embodiment of an architecture according to the present invention.

FIG. 1 illustrates an embodiment of an architecture according to the present invention. As shown, a server 10 includes a graphical user interface 12 connected to a processor 14. The processor 14 is connected to a memory 16. The server 10 is directly accessible by a user input device 18 (e.g., a display, keyboard and mouse). The server 10 is also accessible by computers 22 and 26 over an intranet 20 and the Internet 24, respectively. The operation of the architecture shown in FIG. 1 will be discussed in detail below.

Creating a Template

Figure 2:
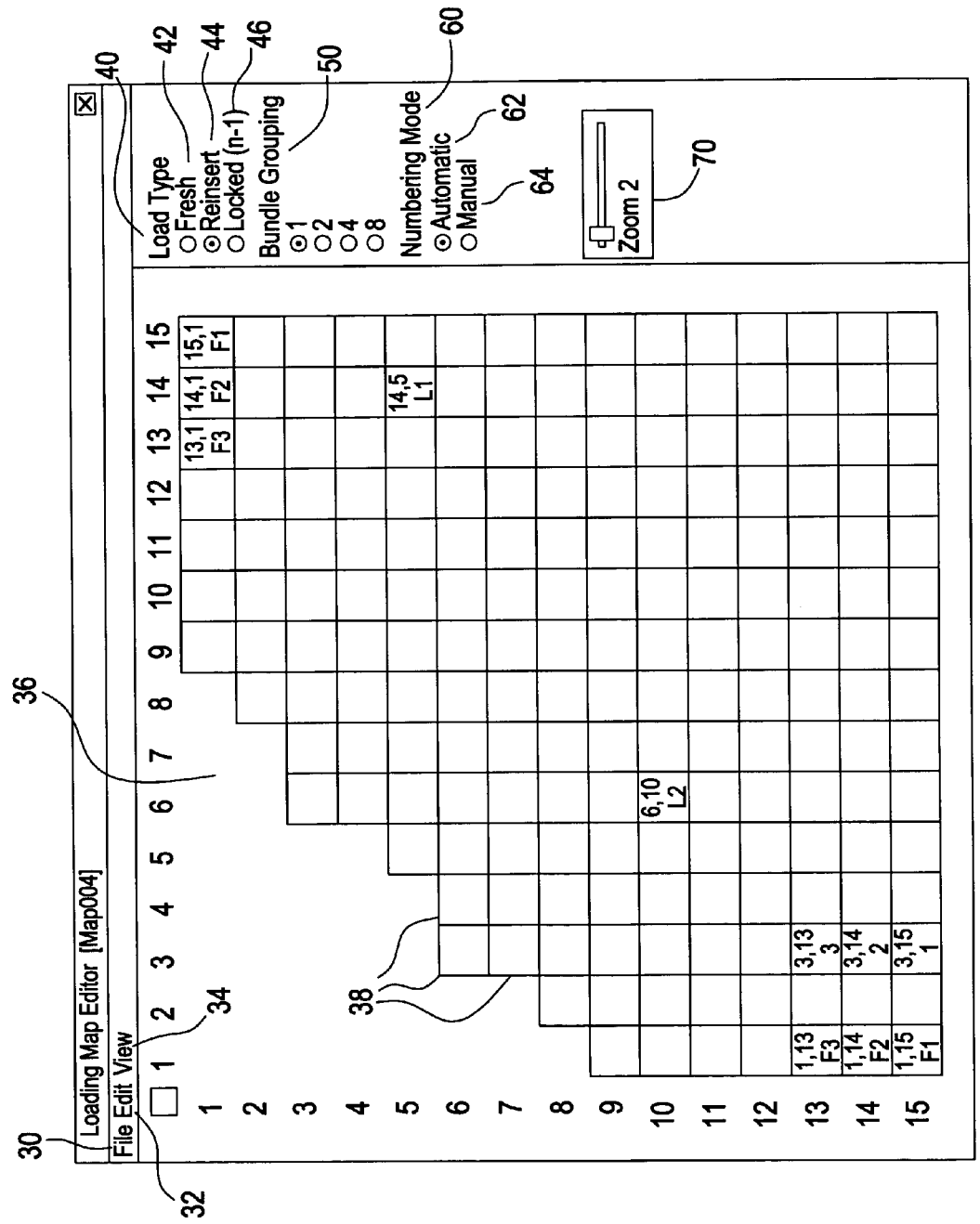
FIG. 2 illustrates a screen shot of a partially completed template designed according to the methodologies of the present invention using the loading map editor of the present invention.

A user via input 18, computer 26 or computer 22 accesses the server 10 over the graphical user interface 12, and runs a loading map editor program stored in memory 16 according to an exemplary embodiment of the present invention. The loading map editor provides for creating and editing a graphical representation of a nuclear reactor core referred to as a template. However, another form of conveying this information, such as a text file, may also be thought of as the template. FIG. 2 illustrates a quarter-core screen shot of a partially completed template designed according to the methodologies of the present invention using the loading map editor of the present invention.

When the loading map editor is initially run, the user has the option via a file menu 30 to access a previously created template or to begin a new template. Assuming the user begins a new template, the loading map editor request the user to identify the nuclear reactor for which the template is being created. The loading map editor then retrieves the geometry of the identified nuclear reactor from a relational database containing nuclear reactor plant characteristics stored in the memory 18. The loading map editor then displays a blank colorless fuel bundle field 36 of the appropriate size based on the retrieved plant characteristics with the rows and columns numbered (such as with the fuel bundle position Row 6, Column 3 in FIG. 2).

Within the fuel bundle field 36, the user may then, for example, using a mouse associated with the input 18, computer 26 and computer 22 click on the fuel bundle positions 38 in the array of possible fuel bundle positions to identify the type (fresh, reinsert, or locked) and grouping of the actual fuel bundle in that position. In the context of a template, a bundle group consists of 1, 2, 4, or 8 bundles and an associated symmetry pairing of bundles within the group which may be performed either mirror or rotationally symmetric. As shown on the right side of FIG. 2, the loading map editor provides several tools for performing this assignment task. Specifically, the tools include the headings Load Type 40, Bundle Grouping 50 and Numbering Mode 60.

Under the Load Type 40 tool heading, the loading map editor includes a Fresh radio button 42, a Reinsert radio button 44 and a Locked radio button 46. The Fresh, Reinsert and Locked radio buttons 42, 44 and 46 correspond to fresh, reinsert and locked fuel bundle categories. The user, for example, clicks on the desired radio button to choose the desired category and then clicks on the fuel bundle position 38 in the fuel bundle field 36 to assign that category to the fuel bundle position 38. The fresh fuel bundle category indicates to insert fuel bundles that have not been exposed. The loading map editor then displays "F" and a number "N" at the bottom of the fuel bundle position 38. The "F" indicates the fresh fuel bundle category, and the number "N" indicates the Nth fresh bundle type 38. As will be appreciated, the loading map editor maintains a count of the number of fuel bundle types assigned to the core. Multiple bundle positions can be assigned the same bundle type by specifying the same "F" and "N" value for each position.

The locked fuel bundle category indicates that a fuel bundle currently occupying an associated fuel bundle position in an actual nuclear reactor core is to remain in that position in creating a new nuclear reactor core loading map. The loading map editor displays "L" and a number "N" in the fuel bundle position 38 when the locked fuel bundle category is assigned. The "L" indicates the locked fuel bundle category, and the number "N" indicates the Nth locked bundle group.

The reinsert fuel bundle category indicates to insert a fuel bundle that has been exposed. The loading map editor displays only a number "N" in the fuel bundle position 38 when the reinsert fuel bundle category is assigned. The number indicates a priority of the fuel bundle position 38. The number and the priority indicated by the number will be described in detail below with respect to the Numbering Mode 60 heading.

In an exemplary embodiment, the loading map editor displays the fuel bundle positions 38 in a color associated with the assigned category. For example, fresh are displayed in blue, locked are displayed in yellow, and reinserted are displayed in violet.

Under the Bundle Grouping 50 heading, the loading map editor includes a "1" radio button, a "2" radio button, a "4" radio button, and an "8" radio button. When the "1" radio button is selected by the user, for example, by clicking on the "1" radio button, the category assigned by the user to a fuel bundle position 38 is associated only with the fuel bundle position 38 chosen. Selecting the "2" radio button and assigning a category to a fuel bundle position 38 causes the category to be assigned to the selected fuel bundle position as well as the fuel bundle position 180 degrees symmetric to the selected fuel bundle position. Selecting the "4" radio button causes the loading map editor to request the user to chose between rotational and mirror symmetry. Rotational symmetry is an image property indicating there is a center point around which the object is turned a certain number of degrees and the object still looks the same (i.e., it matches itself a number of times while it is being rotated). Mirror symmetry (or line symmetry) indicates a correspondence in size, shape, and relative position of parts on opposite sides of a dividing line. If the user assigns a category to a fuel bundle position when rotational symmetry is chosen, this causes the category to be assigned to the selected fuel bundle position as well as the fuel bundle position 38 in each of the other quadrants rotationally symmetric to the selected fuel bundle position. If the user assigns a category to a fuel bundle position when mirror symmetry is chosen, this causes the category to be assigned to the selected fuel bundle position as well as the fuel bundle position in each of the other quadrants symmetric to the selected fuel bundle position.

Selecting the "8" radio button causes the loading map editor to consider the total fuel bundle field 36 as octant symmetric—eight symmetric pie pieces. Assigning a category to a fuel bundle position when the "8" radio button is selected causes the category to be assigned to the selected fuel bundle position 38 as well as the fuel bundle positions 38 in each of the other eight pie pieces symmetric to the selected fuel bundle position 38.

When the loading template is being used, such as to form a loading map, selecting (for example, by clicking on) a fuel bundle position 38 will cause the loading map editor to highlight the members of the group including the selected fuel bundle position 38.

Under the Numbering Mode 60 heading, the loading map editor includes an Automatic radio button 62 and a Manual radio button 64. Choosing between an automatic numbering mode by selecting the Automatic radio button 62 and a manual numbering mode by selecting the Manual radio button 64 is only permitted when the Reinsert radio button 44 or Fresh radio button 42 has been selected. The numbering mode in general is inapplicable when the Locked radio button 46 is selected.

When the Automatic radio button 62 is selected, the loading map editor, which maintains a count of the number of fuel bundle positions 38 assigned the reinsert fuel bundle category, assigns the count plus one to the next fuel bundle position 38 assigned the reinsert fuel bundle category. The assigned number is displayed at the bottom of the fuel bundle position 38. Likewise, the loading map editor maintains a count of the fresh bundle types. When a fuel bundle position 38 is assigned the fresh bundle category the count plus one, referred to above as N, is assigned to that position. "F" and the value of N are displayed at the bottom of the fresh fuel bundle position.

When the Manual radio button 64 is selected, the loading map editor maintains the count of the number of fuel bundle positions 38 assigned the reinsert fuel bundle category, but does not assign numbers to the fuel bundle positions 38. Instead, the user may position a cursor in the fuel bundle position 38 and enter the number manually. As alluded to above, the assigned numbers represent assigned priorities. The priorities indicate an order for loading exposed fuel bundles based on an attribute of the exposed fuel bundles. The attributes include, but are not limited to, K infinity (which is a well-known measure of the energy content of the fuel bundle, exposure of the bundle (which is accumulated megawatt days per metric ton of uranium in the bundle), residence time of the bundle (which is how long the bundle has been resident in the nuclear reactor core), etc. In one exemplary embodiment, the shade of the color associated with the reinserted fuel bundle positions varies (lighter or darker) in association with the assigned priority.

The loading map editor according to the present invention also provides several viewing options via a view menu 34 and a zoom slide button 70. Adjusting the zoom slide button 70 by clicking and dragging the zoom slide button 70 to the left and the right decreases and increases the size of the displayed fuel bundle field 36. Under the view menu 34, the user has the option to view a single quadrant of the template, or a full core view of the template. Additionally, the user can control whether certain template attributes are displayed. Specifically, the view menu 34 includes the options of displaying the following in the loading template: control blades, bundle coordinates, core coordinates, etc.

Having created the loading template, the user may save the template, or even a partially created template, to the memory 18 by selecting either the "Save" or "Save As" option in the file menu 30.

As discussed above, instead of creating a new template, a previously created template may be viewed and, optionally, edited. Using the file menu 30, the user selects an "open" option. The loading map editor then displays the accessible templates stored in the memory 18 or a directory of memory 18. The user then selects an accessible template, for example, by clicking on one of the accessible templates. The loading map editor will then display the chosen template.

The user may then edit the chosen template. For example, after selecting a fuel bundle position 38 the user may select under the edit menu to "clear" the category assigned to the fuel bundle position 38. Besides the category assigned to this fuel bundle position 38, the loading map editor also clears the category assigned to associated fuel bundle positions 38. Associated fuel bundle positions 38 are those fuel bundle positions 38 that were assigned the fuel bundle category along with the fuel bundle position 38 selected for clearing because of the bundle grouping chosen when the category was assigned to the fuel bundle position 38 chosen for clearing.

When fuel bundle positions 38 assigned the fresh or reinserted category are cleared, the loading map editor adjusts the numbering associated with that category. In the case of the fresh bundle category, this is a conditional action based on whether other bundle positions have been assigned the same fresh bundle type. Specifically, the loading map editor performs a cascade operation such that fuel bundle positions assigned the same category and having higher numbers are renumbered in sequence beginning from the lowest number of a deleted fuel bundle position. For example, if reinsert bundle positions numbered 44, 43 and 42 were cleared, then reinsert bundle position having number 45 would be renumbered 42, reinsert bundle position having number 46 would be renumbered 43, etc. The loading map editor also changes the total count of fuel bundle positions assigned the category being cleared.

When unassigned bundle positions are created through editing, the user may then newly assign categories to the unassigned bundle positions in the same manner and using the same tools to create a template as described above. In so doing, the user may decide to manually assign, for example, an existing priority to a newly assigned reinsert fuel bundle position. In this instance, the reinsert fuel bundle position already having this number and each reinsert fuel bundle position having a higher number are incremented by one.

As a further alternative, the user may want to adapt an existing template for one reactor to another reactor of the same size and physical bundle configuration. To do this, the user may use the "save as" feature in the file menu 30 to create a duplicate of the loading template. Subsequent changes to the bundle field will then apply to the copied template.

In addition to creating a template from 'scratch' or editing an existing template, the user may have the loading map editor derive a template from a previously loaded core. In the loading map editor, using the file menu 30, the user selects an "auto-generate template" option. The loading map editor then displays a list of the accessible fuel cycles stored in the memory 18. Each fuel cycle corresponds to an actual loading map for a fuel cycle of a nuclear reactor. As will be appreciated, the memory 18 may store loading maps for cycles of different nuclear reactors. Accordingly, the list of cycles displayed by the loading map editor identifies both the nuclear reactor and the cycle. From the list the user selects the cycle (hereinafter "the selected cycle") that the template will be derived from. The loading map editor then accesses the loading map for the selected cycle.

The user is then presented with a dialog box for entering input parameters of the derivation process. The input parameters include: a primary attribute (e.g., exposure, K infinity, etc.) for deriving the template, a tolerance level (discussed in detail below), group list members (8, 4, or 2 bundle groupings), bundle symmetry for groups of 4, and a maximum number of assignments to each group list member. For example the user may enter K infinity as the primary attribute, and a tolerance level of 0.2 (which, as described in detail below, is used for forming bundle groups). The user may further enter that groups of 8 and 4 are permitted, the groups of 4 should have mirror symmetry and that a maximum of 14 groups of 4 are permitted. In an exemplary embodiment, the loading map editor provides the user with a drop-down menu. The user selects list members desired for the template from the options given in the drop-down menu. These options include: groups of 8, 4 and 2; groups of 8 and 4; groups of 8 (which forces groups of 4 on the minor axis of the reactor core template); and groups of 4 and 2. In selecting the maximum number of assignments for each group, the user enters this data in the order of the smallest to the largest group size. However, the maximum number of assignments for the largest groups is not entered by the user, as this value is automatically determined based on the maximum number of assignments for the smaller groups.

Once the user enters the input parameters, the loading map editor will begin generating a template.

First the loading map editor asks the user if locked bundle positions are permitted, if so, then the loading map editor requests the user to identify the cycle previous to the selected cycle in the same manner that the selected cycle was identified. The loading map editor then compares the loading map for the selected cycle with the loading map for the previous cycle of the identified nuclear reactor. Specifically, for each bundle position in the reactor, the loading map editor determines if loading maps for the selected and previous cycles have a bundle with the same serial number in the same bundle position. If so, the bundle position is assigned the locked fuel bundle category in the loading template.

After the locked fuel bundle positions are identified, the loading map editor identifies the fresh fuel bundle positions. Specifically, for each bundle position not already identified as a locked bundle position, the loading map editor determines from the characteristics of the selected loading map if the fuel bundle in that bundle position is a fresh fuel bundle. For each identified fresh fuel bundle, the loading map editor also determines the type of fresh fuel bundle from the characteristics of the selected loading map. The loading map editor then assigns the fresh fuel category to the associated fuel bundle position in the template and assigns a type count number N to the fuel bundle position. For each type of fresh fuel bundle located in the selected loading map, the loading map editor assigns a count value to that type. This count value is then assigned to the bundle position along with the fresh fuel bundle category assignment so that fresh fuel bundle positions that should have the same type of fresh fuel bundle are identified by the same value 'N' in the loading template.

Next, the loading map editor determines whether the identified fresh bundle category positions form any bundle groups. As discussed above, the user identifies the bundle group members permitted in the template. The bundle group members form a group members list. For each bundle position assigned the fresh fuel bundle category, the loading map editor first determines if the bundle position (hereinafter the "current bundle position") has already been assigned to a group. If so, then the loading map editor proceeds to the next bundle position. If not, then the loading map editor selects the largest group from the group member list and identifies each of the bundle positions that form such a group with the current bundle position. If each of the bundles positions forming the group has been assigned the fresh bundle category and are of the same type as the current bundle position, then the loading map editor records the group of bundle positions as a group. If each of the bundles positions forming the group has not been assigned the fresh bundle category or one of the bundles is not the same type as the current bundle position, then the loading map editor performs the above-described process for the next largest bundle group in the group member list. This process keeps repeating until a group is formed or there are no more groups in the group member list to test. If the members of the group member list have been tested, and no group has been formed, then the current bundle position is recorded as not belonging to a group.

Next, the loading map editor identifies the reinserted fuel bundle positions. The bundle positions of the template not assigned to the locked or fresh fuel bundle categories are assigned the reinserted fuel bundle category. Then, the loading map editor determines whether the reinserted bundle category positions form any bundle groups. For each bundle position assigned the reinserted fuel bundle category, the loading map editor first determines if the bundle position (hereinafter the "current bundle position") has already been assigned to a group. If so, then the loading map editor proceeds to the next bundle position. If not, then the loading map editor selects the largest group from the group member list and identifies each of the bundle positions that form the group with the current bundle position. If each of the bundles positions forming the group has not been assigned the reinserted bundle category, then the loading map editor determines if the next largest group in the group member list includes all reinserted fuel bundle positions. If no group from the group member list results in a group of reinserted fuel bundles, then the loading map editor records the current fuel bundle position as not belonging to a group.

Once a group has been formed, the loading map editor calculates the average attribute value for the group. As discussed above, the user identified a primary attribute to use in deriving the template. Here, the loading map editor uses that attribute value for each fuel bundle in the selected loading map forming the associated group in the template to calculate the average attribute value. The loading map editor then determines if the attribute value for each fuel bundle in the group is with the tolerance level from the average attribute. Again, here, the tolerance level was a user input design parameter as discussed above.

If the attribute value for each fuel bundle in the group is within the tolerance level of the average attribute value, then the loading map editor records the associated fuel bundle positions in the template as belonging to a group. Otherwise, the loading map editor performs the above-described process for the next largest bundle group in the group member list. This process keeps repeating until a group is formed or there are no more groups in the group member list to test. If the members of the group member list have been tested, and no group has been formed, then the current bundle position is recorded as not belonging to a group.

The loading map editor then determines if the user specified maximum for a group in the group member list has been violated. If so the editor performs a group recombination and ranking process. For example, if the number of groups of 2 exceeds the user specified maximum the editor does the following: For each group of 2, the loading map editor determines if another group of 2 forms a group of 4 meeting the symmetry requirements entered by the user. The loading map editor then determines the average attribute value and standard deviation for each newly formed potential group of 4 and ranks the potential groups of 4 based on minimum standard deviation. Next, the highest ranked groups (i.e., those with the lowest standard deviation) are assigned to the groups of 4 until the groups of 2 list does not exceed the maximum number allowed based on the user input. Those potential groups of 4 not assigned remain as groups of two. Next, the same process is performed to combine groups of 4 into groups of 8 assuming the user input parameters permit groups of 8 and the user specified maximum for groups of 4 has been violated.

As a final step, the reinserted fuel bundles are assigned a priority number that, as described above, appears in the template. The fuel bundles positions are ranked based on (1) the attribute value for the fuel bundle in the associated position in the loading map if the fuel bundle position does not form part of a group; or (2) by the average attribute value of the group if fuel bundle position does form part of a group. A priority number is then assigned by this ranking with the fuel bundles having the same average attribute assigned the same priority number.

This completes the template derivation process, the resulting template is then displayed in the loading map editor allowing the user to save the resulting template for future use.

Using the present invention as described above, a core designer may capture his experience and rules of thumb associated with the initial design of a loading map. Furthermore, this knowledge may then be used by others to improve or adapt templates to existing core designs.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A method for creating a nuclear reactor core template, comprising:

selectively assigning, using a graphical user interface providing a graphical representation of a nuclear reactor core, fuel bundle categories to fuel bundle positions in the graphical representation to create a template having as constraints that only a fuel bundle matching the assigned fuel bundle categories to the fuel bundle positions be allowed to be loaded in the fuel bundle position, one of the fuel bundle categories being reinserted fuel bundles; and automatically assigning a priority to each of the fuel bundle positions assigned the reinserted category, the priority indicating an order for loading exposed fuel bundles based on an attribute of the exposed fuel bundles.

2. The method of claim 1, wherein the fuel bundle categories include fresh and locked, the fresh category indicating to insert an unexposed fuel bundle, the locked category indicating that a fuel bundle currently occupying an associated fuel bundle position in an actual nuclear reactor core remains in that position in creating a new nuclear reactor core loading map.

3. The method of claim 2, wherein the fuel bundle categories further include reinserted, the reinserted category indicates to insert a fuel bundle that has been exposed.

4. The method of claim 1, wherein the selectively assigning step includes setting a bundle group amount for a selected one of the fuel bundle categories, and selectively assigning the set bundle group amount of the selected fuel bundle category.

5. The method of claim 1, wherein the selectively assigning step includes selectively setting a symmetry associated with the set bundle group amount, the symmetry indicating whether to repeat the selected fuel bundle category symmetrically in one or more quadrants of the graphical representation of the nuclear reactor core.

6. The method of claim 1, wherein
at least one category is fresh, the fresh category indicating to insert an unexposed fuel bundle; and
the selectively assigning step includes assigning a type designation to the fuel bundle positions assigned the fresh fuel bundle category.

7. The method of claim 1, wherein
at least one category is reinserted fuel bundles, the reinserted category indicates to insert a fuel bundle that has been exposed; and
the selectively assigning step including manually assigning a priority to each of the fuel bundle positions assigned the reinserted category, the priority indicating an order for loading exposed fuel bundles based on an attribute of the exposed fuel bundles.

8. The method of claim 1, wherein the step of creating the template comprises editing an existing nuclear reactor core template by changing a fuel bundle category assigned to at least one fuel bundle position in the template.

9. The method of claim 8, wherein the fuel bundle categories include at least one of fresh, locked and reinserted, the fresh category indicating to insert an unexposed fuel bundle, the locked category indicating that a fuel bundle currently occupying an associated fuel bundle position in an actual nuclear reactor core remains in that position in creating a new nuclear reactor core loading map, and the reinserted category indicates to insert a fuel bundle that has been exposed.

10. The method of claim 8, wherein creating the existing nuclear reactor core template step comprises:
accessing a database of templates; and
selecting one of the templates for editing.

11. The method of claim 1, wherein the step of creating the template comprises:
deriving a loading template from a loading map of a selected cycle of nuclear reactor based on the user input parameters.

12. The method of claim 11, wherein the deriving step derives the loading template from the loading map of the selected cycle of the nuclear reactor and the loading map of a cycle previous to the selected cycle.

13. An apparatus for creating a nuclear reactor core template comprising:
a graphical user interface; and
a processor controlling the graphical user interface to display a graphical representation of a nuclear reactor core, and to provide a user with graphical tools for at least one of assigning fuel bundle categories to fuel bundle positions in the graphical representation and editing assigned fuel bundle categories to the fuel bundle positions in the graphical representation to create a template having as constraints that only a fuel bundle matching the assigned fuel bundle categories to the fuel bundle positions be allowed to be loaded in the fuel bundle position, one of the fuel bundle categories being reinserted fuel bundles, the processor automatically assigning a priority to each of the fuel bundle positions assigned the reinserted category, the priority indicating an order for loading exposed fuel bundles based on an attribute of the exposed fuel bundles.

* * * * *